(12) United States Patent
Kubogata

(10) Patent No.: US 11,532,618 B2
(45) Date of Patent: Dec. 20, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masayuki Kubogata, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/407,946

(22) Filed: Aug. 20, 2021

(65) Prior Publication Data

US 2022/0320080 A1    Oct. 6, 2022

(30) Foreign Application Priority Data

Mar. 30, 2021    (JP) ............................. JP2021-057051

(51) Int. Cl.
*H01L 29/423* (2006.01)
*H01L 27/088* (2006.01)
*H01L 29/45* (2006.01)
*H01L 29/78* (2006.01)

(52) U.S. Cl.
CPC ........ *H01L 27/088* (2013.01); *H01L 29/4236* (2013.01); *H01L 29/45* (2013.01); *H01L 29/7827* (2013.01)

(58) Field of Classification Search
CPC .. H01L 29/4236; H01L 29/45; H01L 29/7827; H01L 27/088
USPC ......................................................... 257/330
See application file for complete search history.

(56) References Cited

U.S. PATENT DOCUMENTS

| 7,772,704 | B2 | 8/2010 | Yoshida et al. |
| 7,781,894 | B2 | 8/2010 | Oikawa |
| 7,915,130 | B2 | 3/2011 | Saito et al. |
| 7,915,740 | B2 | 3/2011 | Yoshida |

(Continued)

FOREIGN PATENT DOCUMENTS

| JP | 2002-368218 A | 12/2002 |
| JP | 2007-184553 A | 7/2007 |
| JP | 2008-109008 A | 5/2008 |

(Continued)

*Primary Examiner* — Monica D Harrison
(74) *Attorney, Agent, or Firm* — Allen & Overy LLP

(57) ABSTRACT

A semiconductor device includes a first transistor, a second transistor, a third electrode, and a control layer. The first transistor includes a first region of a semiconductor layer, a first electrode, and a first gate electrode. The first electrode is electrically connected with the first region. The first gate electrode is located in the first region. The second transistor includes a second region of the semiconductor layer, a second gate electrode, and a second electrode. The second region is next to the first region. The second gate electrode is located in the second region. The second electrode is electrically connected with the second region. The third electrode is electrically connected with the first and second transistors. The control layer has a smaller linear expansion coefficient than the third electrode.

5 Claims, 13 Drawing Sheets

(56) References Cited

U.S. PATENT DOCUMENTS 10,811,445 B2 * 10/2020 Murai ................ H01L 27/1248
2008/0099926 A1   5/2008 Yoshida

FOREIGN PATENT DOCUMENTS

| JP | 2010-205761 A | 9/2010 |
| JP | 5073992 B2 | 11/2012 |
| JP | 2013-069852 A | 4/2013 |
| JP | 5261636 B2 | 8/2013 |
| JP | 2016-086006 A | 5/2016 |

* cited by examiner

| SUBSTANCE | LINEAR EXPANSION COEFFICIENT [$\times 10^{-6}$] |
|---|---|
| Si | 2.8 |
| Ag | 19.7 |
| Cu | 16.5 |
| Ti | 8.5 |
| Ni | 13.3 |
| W | 4.3 |
| Mo | 4.9 |
| Cr | 6.2 |

SEMICONDUCTOR DEVICE

CROSS-REFERENCE TO RELATED APPLICATIONS

This application is based upon and claims the benefit of priority from Japanese Patent Application No. 2021-057051, filed on Mar. 30, 2021; the entire contents of which are incorporated herein by reference.

FIELD

Embodiments relate to a semiconductor device.

BACKGROUND

Existing technology forms two transistors, e.g., metal-oxide-semiconductor field-effect transistors (MOSFETs) in one semiconductor chip. The two MOSFETs include a common drain electrode.

The film thickness of a metal layer of the common drain electrode is increased to reduce the resistance in the on-operation. On the other hand there is a tendency to reduce the thickness of the semiconductor element region of the semiconductor device to reduce the resistance in the on-operation. Therefore, there is a risk that the semiconductor element region may warp in the manufacturing processes of the semiconductor device or when mounting the semiconductor device to a wiring substrate; and cracks may occur.

BRIEF DESCRIPTION OF THE DRAWINGS

FIG. 2 shows linear expansion coefficients of substances used in the drain electrode and the control layer;

DETAILED DESCRIPTION

Figure 1:
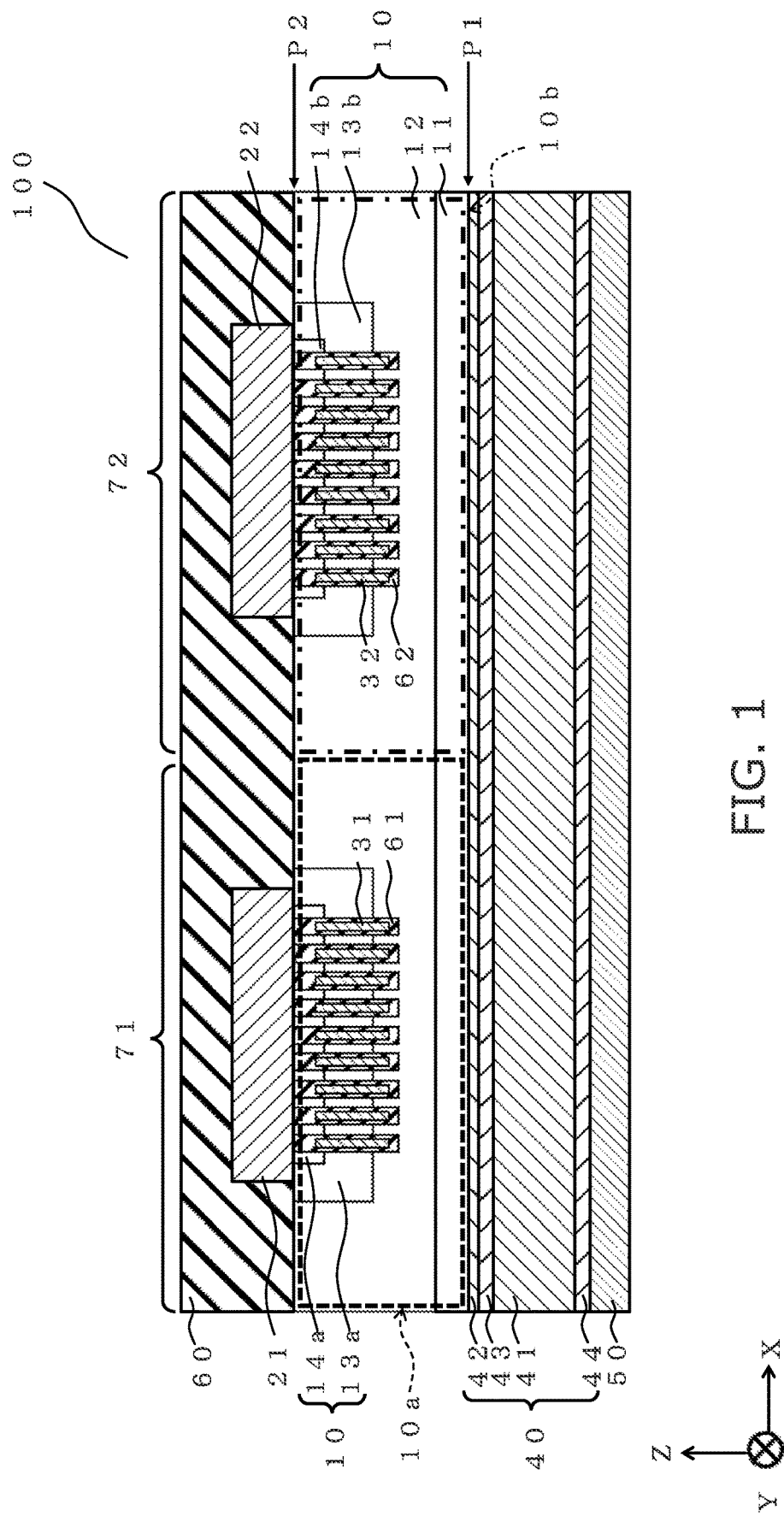
FIG. 1 is a cross-sectional view of a semiconductor device 100 according to a first embodiment.

A semiconductor device of an embodiment includes a first transistor, a second transistor, a third electrode, and a control layer. The first transistor includes a first region of a semiconductor layer, a first electrode, and a first gate electrode. The first region of the semiconductor layer includes a first surface, and a second surface that faces the first surface in a first direction. The first electrode is electrically connected with the second surface of the first region. The first gate electrode is located in the first region. The second transistor includes a second region of the semiconductor layer, a second gate electrode, and a second electrode. The second region of the semiconductor layer is next to the first region in a second direction crossing the first direction, and includes the first and second surfaces. The second gate electrode is located in the second region. The second electrode is separated from the first electrode, and is electrically connected with the second surface of the second region. The third electrode is located at the first surface side, and is electrically connected with the first and second transistors. The third electrode is positioned between the first surface and the control layer; and the control layer has a smaller linear expansion coefficient than the third electrode.

Embodiments of the invention will now be described with reference to the drawings, Common portions in all of the drawings of the description are marked with common reference numerals. The dimensional ratios of the drawings are not limited to the illustrated ratios. The embodiments do not limit the invention.

First Embodiment

Structure of Semiconductor Device 100

Figure 3:
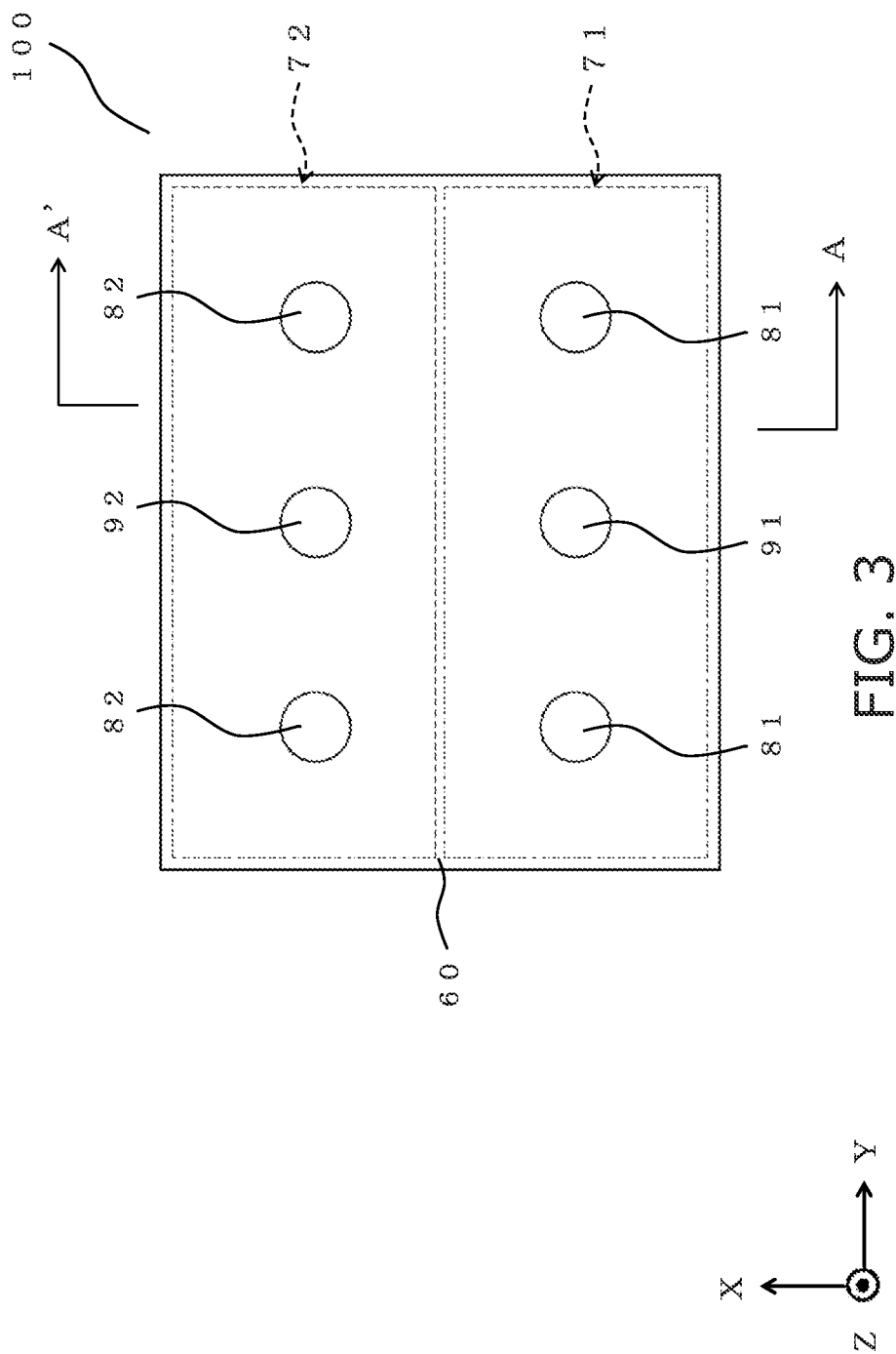
FIG. 3 is a plan view of the semiconductor device 100 according to the first embodiment.

A detailed structure of a semiconductor device 100 according to a first embodiment will now be described with reference to FIGS. 1 to 3. FIG. 1 is a cross-section& view of the semiconductor device 100 according to the first embodiment. FIG. 2 shows linear expansion coefficients of substances used in a drain electrode 40 and a control layer 50. FIG. 3 is a plan view of the semiconductor device 100 according to the first embodiment.

In the following description, the notations of $n^+$, n, $n^-$, $p^+$, p, and $p^-$ indicate relative levels of the impurity concentrations of the conductivity types. In other words, $n^+$ indicates that the n-type impurity concentration is relatively higher than that of n; and $n^-$ indicates that the n-type impurity concentration is relatively lower than that of n. Also, p indicates that the p-type impurity concentration is relatively higher than that of p; and $p^-$ indicates that the p-type impurity concentration is relatively lower than that of p. The $n^+$-type and the $n^-$-type may be recited as simply the n-type; and the $p^+$-type and the $p^-$-type may be recited simply as the p-type.

The semiconductor device 100 according to the first embodiment illustrated in FIG. 1 is a switching device that controls the flow of a bidirectional current. For example, the semiconductor device 100 according to the first embodiment is used in the protection circuit of a battery. In the semiconductor device 100 according to the first embodiment, two trench-gate MOSFETs are connected to have a common drain electrode.

The semiconductor device 100 according to the first embodiment includes a semiconductor layer 10, a first source electrode (a first electrode) 21, a second source electrode (a second electrode) 22, a first gate electrode 31, a second gate electrode 32, the drain electrode (a third electrode) 40, the control layer 50, a first source electrode pad 81, a second source electrode pad 82, a first gate electrode pad 91, and a second gate electrode pad 92.

The semiconductor layer 10 includes a first surface P1, a second surface P2, a first region 10a, and a second region 10b. In FIG. 1, the first region 10a is shown by a dashed line; and the second region 10b is shown by a single dot-dash line.

The direction from the first surface P1 toward the second surface P2 is taken as a Z-direction (a first direction). A direction orthogonal to the Z-direction is taken as an X-direction (a second direction); and a direction orthogonal to the X-direction and the Z-direction is taken as a Y-direction (a third direction). The semiconductor device 100 shown in FIG. 1 is a cross-sectional view in the X-Z plane. In the description, the direction from the first surface P1 toward the second surface P2 is called "up"; and the opposite direction is called "down".

The first region 10a is located in the semiconductor layer 10 and includes the first surface P1 and the second surface P2. The second region 10b includes the first surface P1 and the second surface P2 and is next to the first region 10a in the X-direction.

The first region 10a includes an n$^+$-type drain region 11, an n$^-$-type drift region 12, a p-type first base region 13a, and an n$^+$-type first source region 14a.

The n$^+$-type drain region 11 is located at the first surface P1 side of the semiconductor layer 10. The n$^-$-type drift region 12 is located on the n$^+$-type drain region 11 in the Z-direction.

Multiple p-type first base regions 13a are provided in the first region 10a. The multiple p-type first base regions 13a are located on the n$^-$-type drift region 12 of the first region 10a and are next to each other with a first insulating film 61 that is described below interposed in the X-direction.

The n$^+$-type first source region 14a is located on the p-type first base region 13a in the Z-direction. In other words, the n$^+$-type first source region 14a is located at the second surface P2 side of the first region 10a.

The second region 10b includes the n$^+$-type drain region 11, the n$^-$-type drift region 12, a p-type second base region 13b, and an n$^+$-type second source region 14b.

Multiple p-type second base regions 13b are provided in the second region 10b. The multiple p-type second base regions 13b are located on the n$^-$-type drift region 12 of the second region 10b and are separated in the X-direction.

The n$^+$-type second source region 14b is located on the p-type second base region 13b in the Z-direction. In other words, the n$^+$-type first source region 14a is located at the second surface P2 side of the second region 10b.

The semiconductor layer 10 includes, for example, silicon (Si) or silicon carbide (SiC) as a semiconductor material. When silicon is used as the semiconductor material, the thickness in the Z-direction of the semiconductor layer 10 is not more than 100 μm.

The first source electrode 21 is located on the n$^+$-type first source region 14a, The first source electrode 21 is electrically connected with the n$^+$-type first source region 14a.

Multiple first gate electrodes 31 are provided in the first region 10a. The first gate electrode 31 is next to the p-type first base region 13a in the X-direction. The first insulating film 61 is located between the first gate electrode 31 and the semiconductor layer 10.

The second source electrode 22 is located on the n$^+$-type second source region 14b. The second source electrode 22 is electrically connected with the n$^+$-type second source region 14b.

Multiple second gate electrodes 32 are provided in the second region 10b. The second gate electrode 32 is next to the p-type second base region 13b in the X-direction, A second insulating film 62 is located between the second gate electrode 32 and the semiconductor layer 10.

A portion of the first source electrode 21, a portion of the second source electrode 22, and a portion of the semiconductor layer 10 are covered with an insulating film 60.

As shown in FIG. 2, the drain electrode 40 includes a first metal layer 41, a second metal layer 42, a third metal layer 43, and a fourth metal layer 44. The drain electrode 40 is located under the n$^+$-type drain region 11 and is electrically connected with the n$^+$-type drain region 11.

The first metal layer 41 is a major path of the current that flows in the on-operation of the semiconductor device 100, and is thickest in the Z-direction among the metal layers of the drain electrode 40. The thickness in the Z-direction of the first metal layer 41 is, for example, not less than 10 The first metal layer 41 is, for example, silver (Ag) or copper (Cu). The second metal layer 42 is located under the n$^+$-type drain region 11. The second metal layer 42 includes a metal, e.g., titanium (Ti) that improves the adhesion with the semiconductor layer 10. The thickness in the Z-direction of the second metal layer 42 is, for example, not more than 1 μm. The third metal layer 43 is located between the first metal layer 41 and the second metal layer 42. The third metal layer 43 is a barrier metal layer that prevents the oxidization of the semiconductor layer (e.g., the n$^+$-type drain region 11) and the diffusion of metal into the semiconductor layers and includes, for example, nickel (Ni). The thickness in the Z-direction of the third metal layer 43 is, for example, 1 The fourth metal layer 44 is located under the first metal layer 41. The fourth metal layer 44 is a corrosion prevention layer that prevents corrosion of the first metal layer 41 and includes, for example, nickel (Ni). The thickness in the Z-direction of the fourth metal layer 44 is, for example, 1 μm. The second metal layer 42, the third metal layer 43, and the fourth metal layer 44 may not be included.

The control layer 50 is located under the fourth metal layer 44, The control layer 50 includes a substance that has a smaller linear expansion coefficient than the metal layer, i.e., the first metal layer 41, that is thickest in the Z-direction among the metal layers of the drain electrode 40. The substance that is included in the control layer 50 is, for example, Si, tungsten (W), molybdenum (Mo), and/or chrome (Cr). The linear expansion coefficients of the substances included in the control layer 50 and the metal layers of the drain electrode 40 are shown in FIG. 2. It is desirable for the control layer 50 to be a hard substance.

A first transistor 71 and a second transistor 72 that have the structure described above are formed in the semiconductor device 100 according to the first embodiment. The first transistor 71 includes the first region 10a, the first source electrode 21, the first gate electrode 31, the first insulating film 61, and the drain electrode 40. The second transistor 72 includes the second region 10b, the second source electrode 22, the second gate electrode 32, the second insulating film 62, and the drain electrode 40. In other words, the first transistor 71 and the second transistor 72 include the common drain electrode 40.

The first gate electrode 31 and the second gate electrode 32 extend in the Y-direction. Similarly to the first and second gate electrodes 31 and 32, the regions that are included in the semiconductor device 100, e.g., the first base region 13a, the second base region 13b, the first source region 14a, and the second source region 14b each extend in the Y-direction.

FIG. 3 is a plan view of the X-Y plane of the semiconductor device 100 according to the first embodiment. FIG. 1 is a cross-sectional view along line A-A' of FIG. 3. The first source electrode pad 81 and the first gate electrode pad 91 are located in the upper portion of the first transistor 71 and are exposed outside the insulating film 60. The first source electrode pad 81 is electrically connected with the first source electrode 21. The first gate electrode pad 91 is electrically connected with the first gate electrode 31. The second source electrode pad 82 and the second gate electrode pad 92 are located in the upper portion of the second transistor 72 and are exposed outside the insulating film 60.

The second source electrode pad 82 is electrically connected with the second source electrode 22. The second gate electrode pad 92 is electrically connected with the second gate electrode 32.

Operations of Semiconductor Device 100

Figure 4:
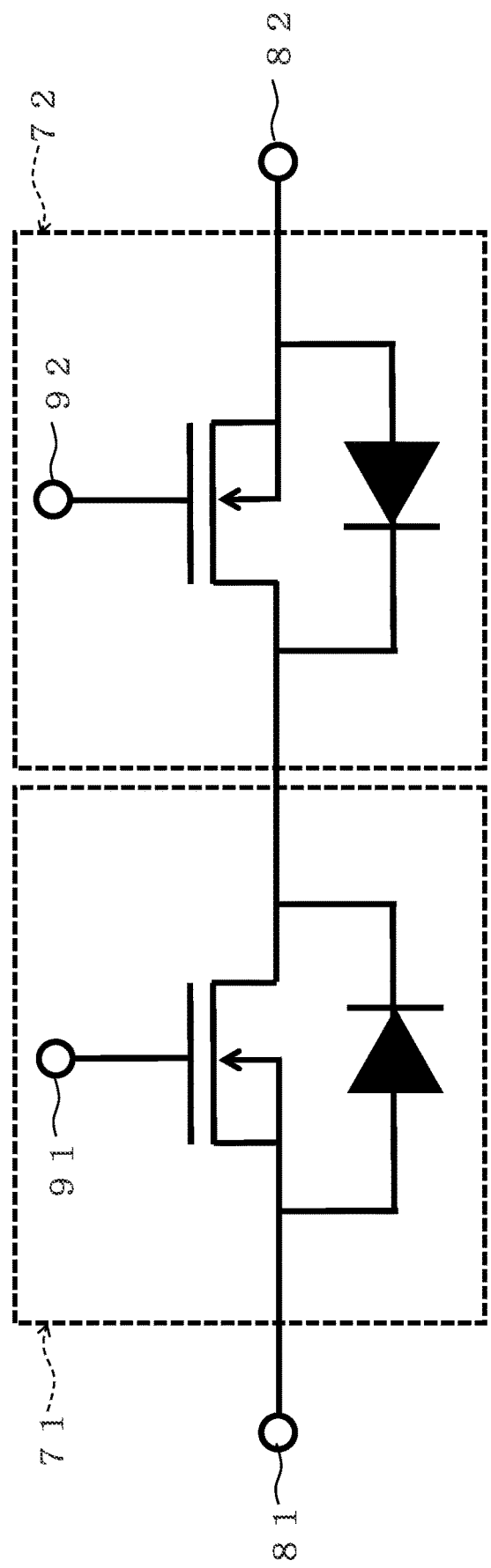
FIG. 4 is an equivalent circuit diagram of the semiconductor device 100 according to the first embodiment.

Operations of the semiconductor device 100 will now be described with reference to FIG. 4, FIG. 4 is an equivalent circuit diagram of the semiconductor device 100 according to the first embodiment.

As described above, for example, the semiconductor device 100 according to the first embodiment is used in the protection circuit of a battery.

When charging and when discharging, voltages that are not less than a threshold are applied to the first and second gate electrodes 31 and 32; and the first transistor 71 and the second transistor 72 are set to the on-state. When charging, a current flows from the first source electrode 21 toward the drain electrode 40. Subsequently, the current passes through the first metal layer 41 of the drain electrode 40 in the X-direction and reaches the second transistor 72, When discharging, a current flows from the second source electrode 22 toward the drain electrode 40. Subsequently, the current passes through the first metal layer 41 of the drain electrode 40 in the X-direction and reaches the first transistor 71.

When overcharged and when over-discharged, a control circuit (not illustrated) sets one of the first transistor 71 or the second transistor 72 to the off-state.

As described above, the semiconductor device 100 controls the flow of a bidirectional current.

Method for Manufacturing Semiconductor Device 100

Figure 5A:
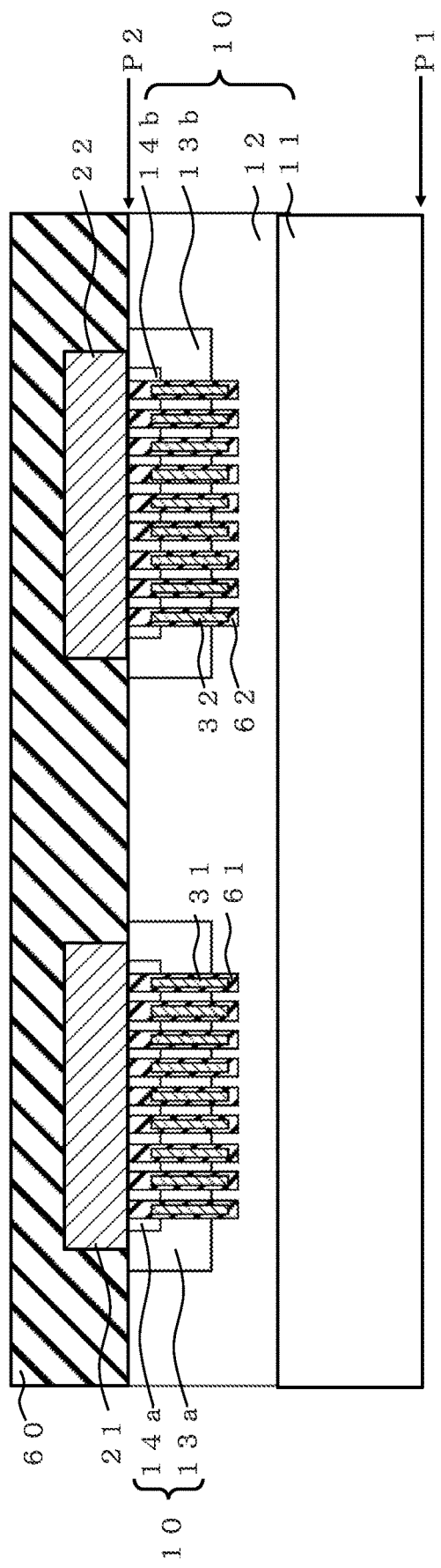
FIGS. 5A and 5B show a method for manufacturing the semiconductor device 100 according to the first embodiment.

FIGS. 5A to 73 are process cross-sectional views illustrating manufacturing processes of the semiconductor device 100 according to the first embodiment, An example of the method for manufacturing the semiconductor device 100 according to the first embodiment will now be described with reference to FIGS. 5A to 7B.

First, an n$^+$-type semiconductor substrate 11 is prepared. The semiconductor substrate 11 becomes the n$^+$-type drain region 11. Then, the n$^-$-type drift region 12 is formed by epitaxial growth on the n$^+$-type semiconductor substrate 11 in the Z-direction.

As shown in FIG. 5A, the first base region 13a, the second base region 13b, the first source region 14a, the second source region 14b, the first gate electrode 31, the second gate electrode 32, the first insulating film 61, the second insulating film 62, the first source electrode 21, the second source electrode 22, the first source electrode pad 81, the second source electrode pad 82, the first gate electrode pad 91, the second gate electrode pad 92, and the insulating film 60 are formed in the drift region 12.

Figure 5B:
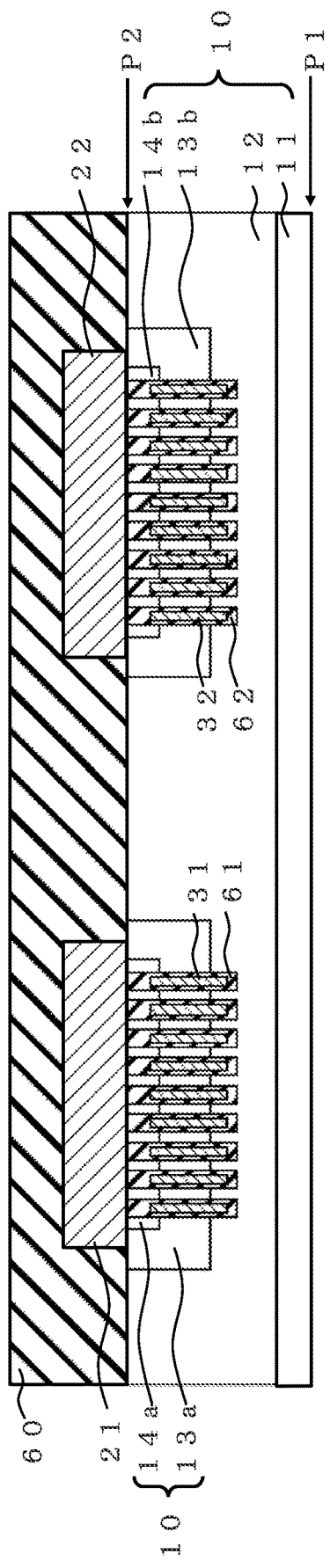

As shown in FIG. 5B, the thickness in the Z-direction of the semiconductor layer 10 is thinned by polishing the n$^+$-type semiconductor substrate 11.

Figure 6A:
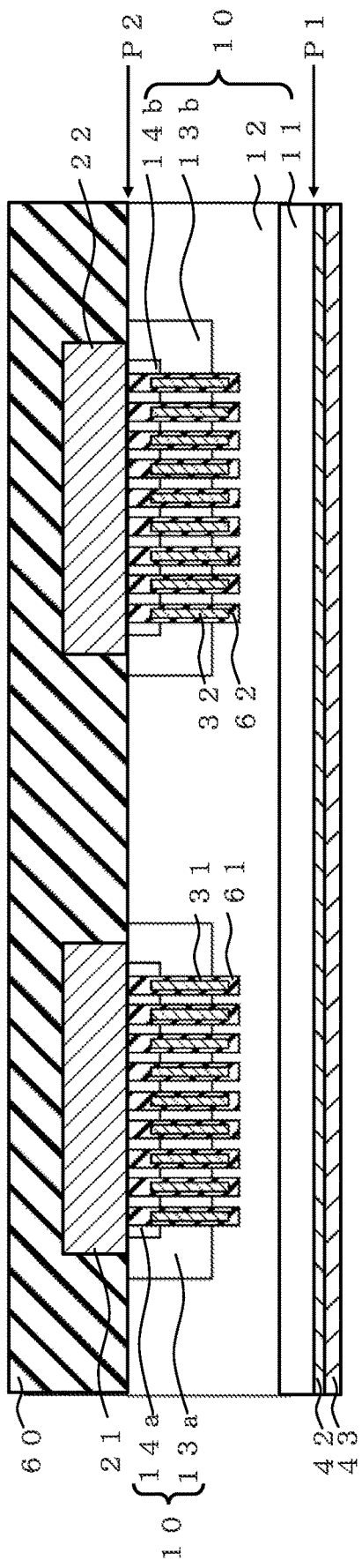
FIGS. 6A and 6B show the method for manufacturing the semiconductor device 100 according to the first embodiment.

As shown in FIG. 6A, the second metal layer 42 and the third metal layer 43 are formed by, for example, sputtering.

Figure 6B:
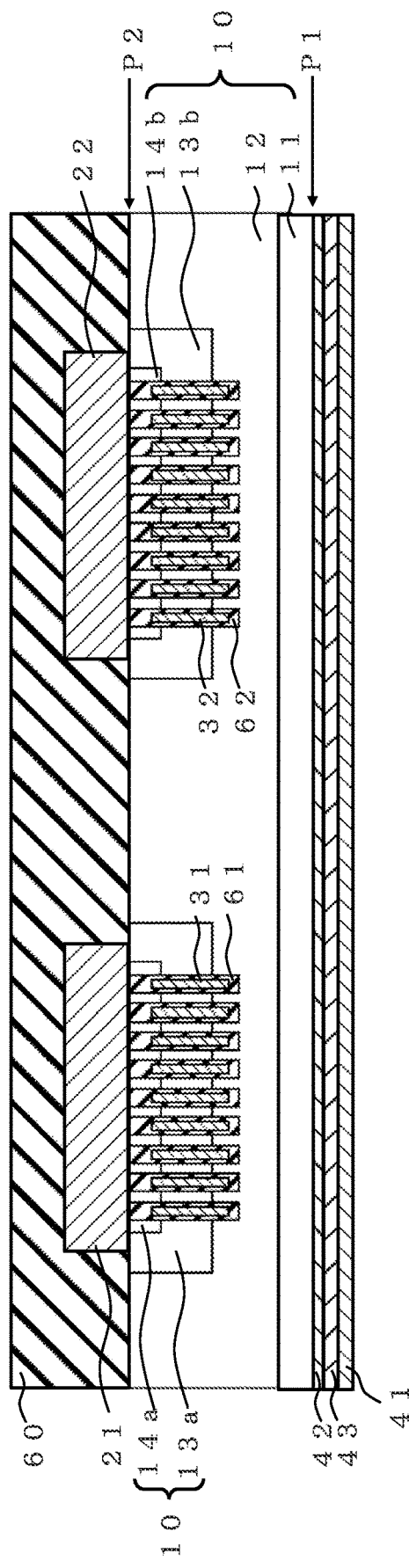
Figure 7A:
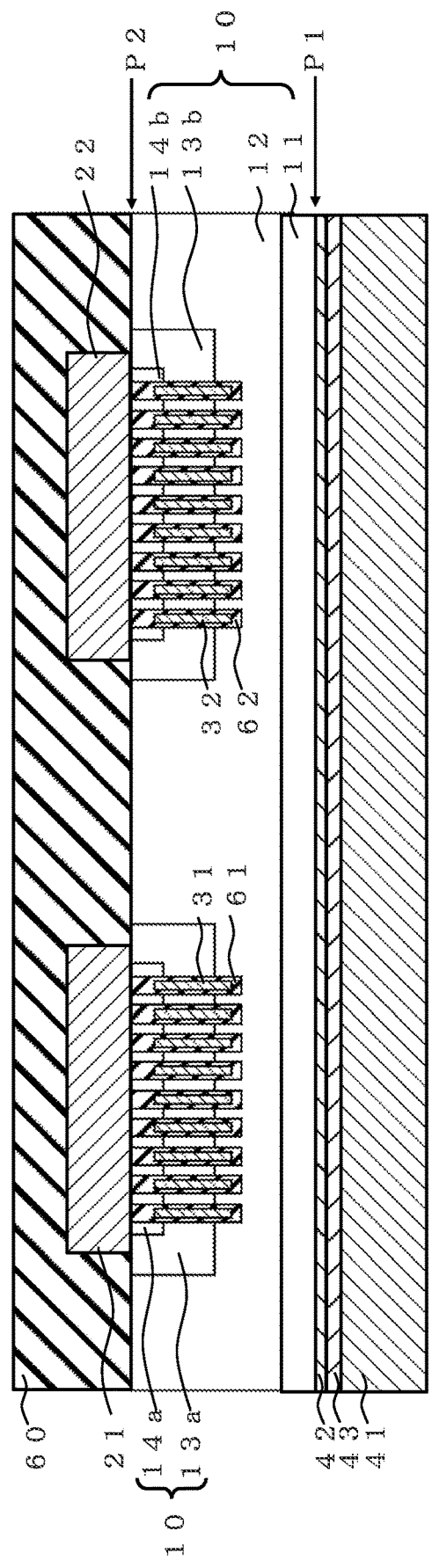
FIGS. 7A and 7B show the method for manufacturing the semiconductor device 100 according to the first embodiment.

As shown in FIG. 6B, a portion of the first metal layer 41 is formed by sputtering. Subsequently, as shown in FIG. 7A, the first metal layer 41 is formed by plating.

Figure 7B:
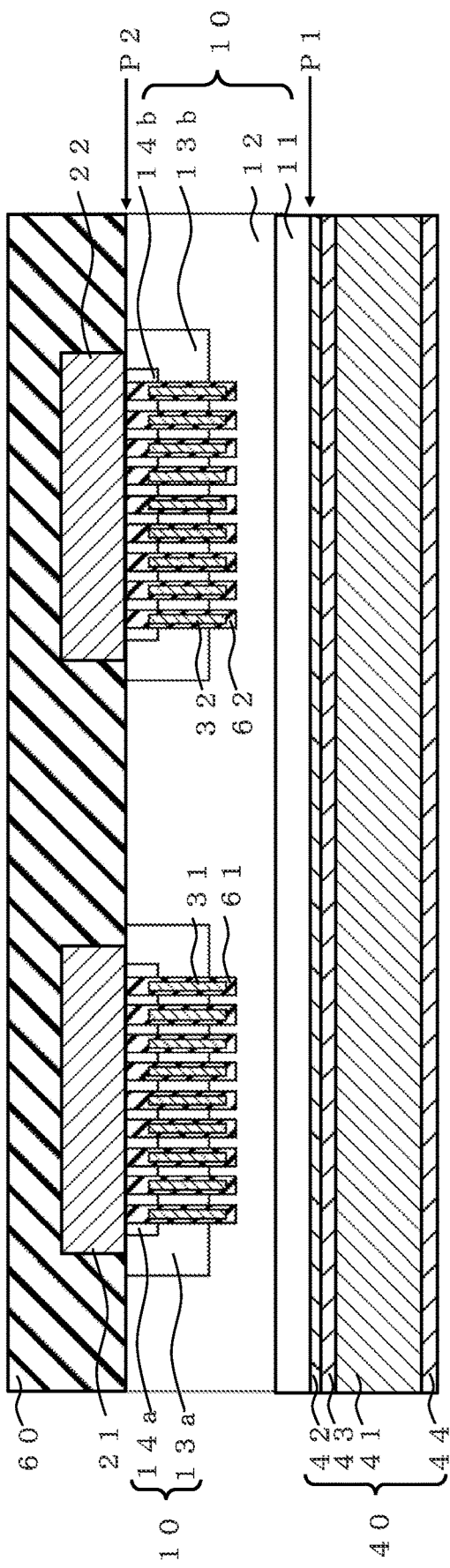

As shown in FIG. 7B, the fourth metal layer 44 is formed by, for example, plating.

Figure 8:
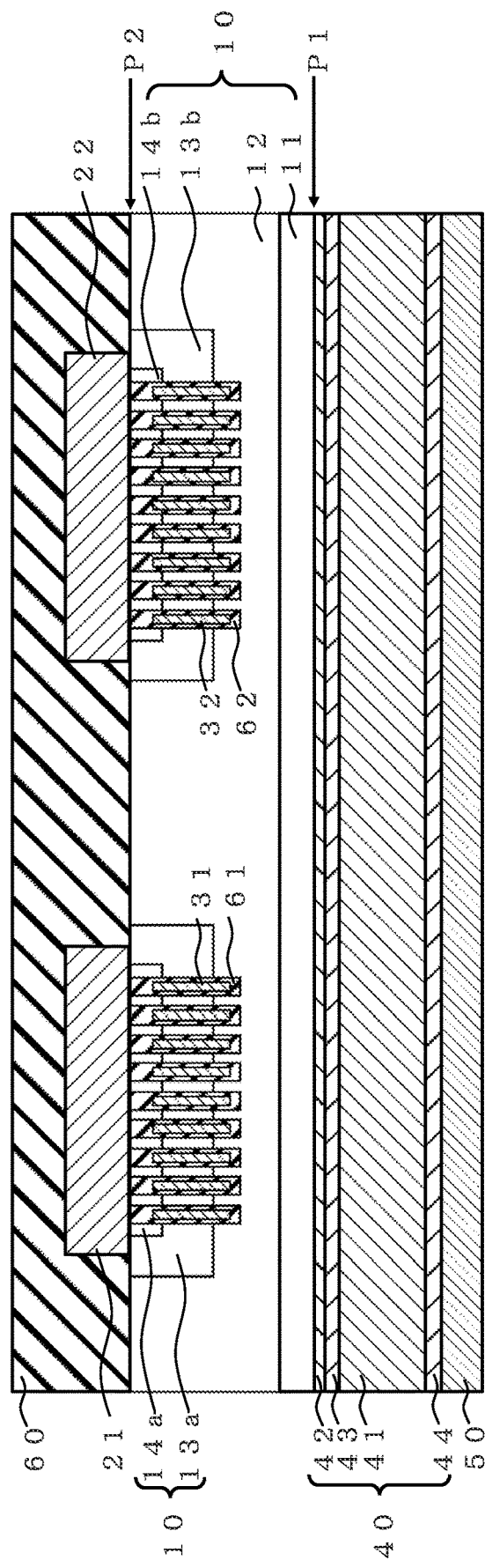
FIG. 8 shows the method for manufacturing the semiconductor device 100 according to the first embodiment.

As shown in FIG. 8, the control layer 50 is formed by, for example, sputtering.

Effects of First Embodiment

Figure 10:
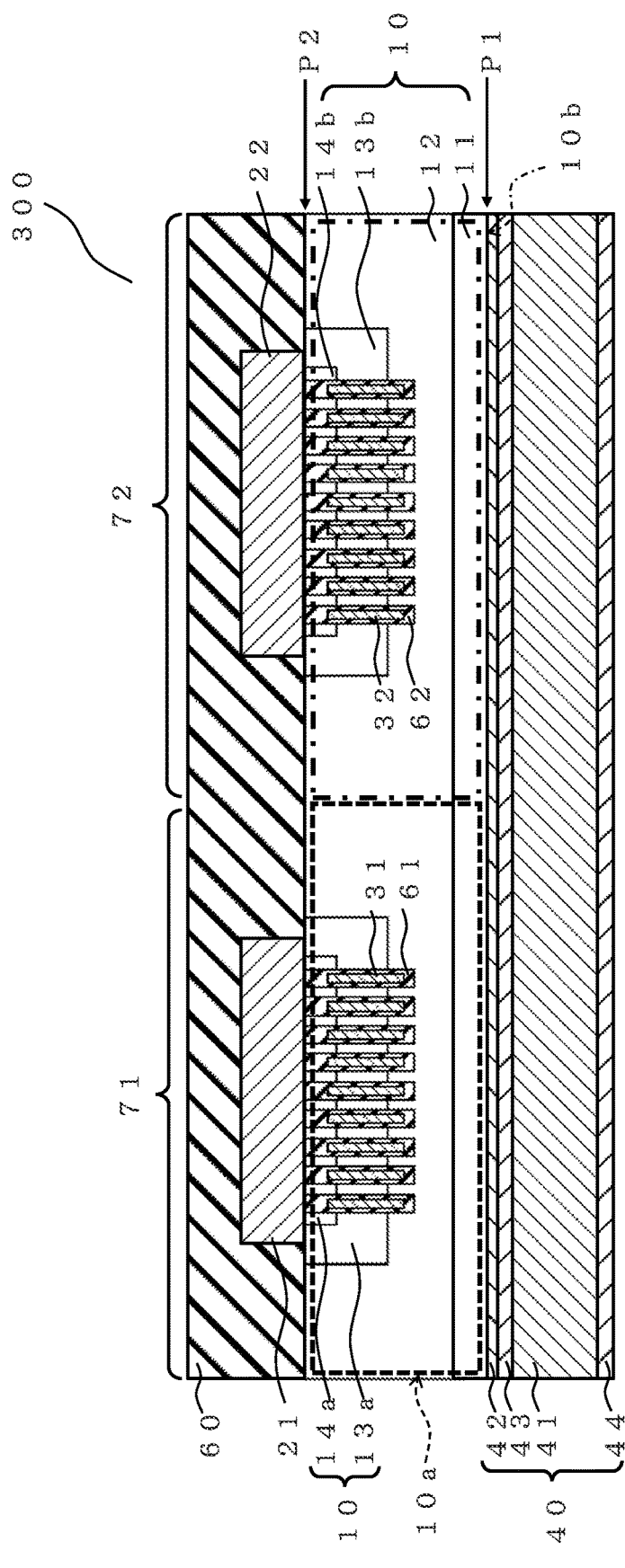
FIG. 10 is a cross-sectional view of a semiconductor device 300 according to a comparative example.

Effects of the semiconductor device 100 according to the first embodiment will now be described using a semiconductor device 300 of a comparative example. FIG. 10 is a cross-sectional view of the semiconductor device 300 according to the comparative example. The semiconductor device 300 of the comparative example differs from the semiconductor device 100 of the first embodiment in that the control layer 50 is not included.

Figure 9:
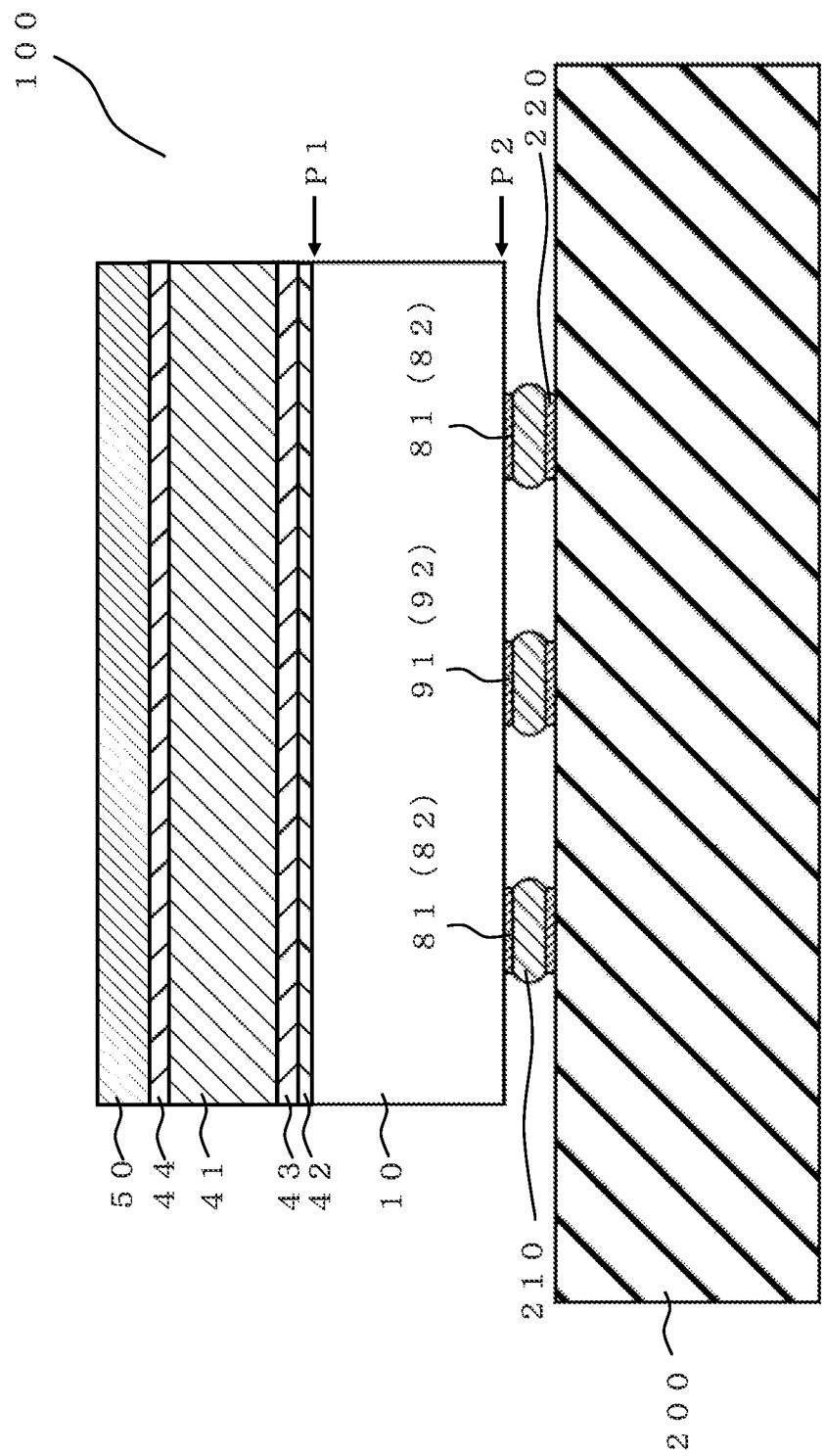
FIG. 9 is a schematic view showing the semiconductor device 100 according to the first embodiment mounted on a wiring substrate.

As shown in FIG. 9, the semiconductor device 300 of the comparative example and the semiconductor device 100 according to the first embodiment are mounted to a wiring substrate 200 in a state in which the drain electrode 40 is oriented upward. In other words, the first source electrode pad 81, the second source electrode pad 82, the first gate electrode pad 91, and the second gate electrode pad 92 of the semiconductor device 100 are bonded to conductor portions 220 of the wiring substrate 200 via bonding materials 210. The bonding materials 210 are, for example, solder. The semiconductor device 100 is sealed with a resin or the like; the resin is not illustrated in FIG. 9.

The temperature of a reflow furnace is increased to connect the first source electrode pad 81, the second source electrode pad 82, the first gate electrode pad 91, and the second gate electrode pad 92 of the semiconductor device 100 by the bonding materials 210.

At this time, thermal expansion of the drain electrode 40 occurs due to the temperature increase, Although thermal expansion of the semiconductor layer 10 also occurs, generally, the linear expansion coefficient of the drain electrode 40 is greater than the linear expansion coefficient of the semiconductor layer 10; therefore, the expansion amount of the drain electrode 40 is greater than that of the semiconductor layer 10. For example, when the major material of the semiconductor layer 10 is Si, and when the major material of the first metal layer 41 that is the thickest in the Z-direction among the metal layers of the drain electrode 40 is Ag, the linear expansion coefficient of Si is $2.8 \times 10^{-6}$, and the linear expansion coefficient of Ag is $19.7 \times 10^{-6}$. The semiconductor layer 10 and the first metal layer 41 of the drain electrode 40 are adhered to each other via the second metal layer 42 and the third metal layer 43; therefore, the surface area of the portion at which the semiconductor layer 10 and the drain electrode 40 are adhered must be constant.

Therefore, bending stress is generated so that the surface area of the drain electrode 40 that has the large expansion amount is increased, and the semiconductor layer 10 and the drain electrode 40 warp to be convex at the drain electrode 40 side. There is a risk that the warp that is caused by the bending stress may cause cracks in the semiconductor layer 10.

To reduce the resistance in the on-operation of the semiconductor device 100, the thickness of the semiconductor layer 10 is reduced, and the thickness of the first metal layer 41 that is the major current path of the drain electrode 40 is increased. In particular, when the semiconductor layer 10 is not more than 100 μm thick, the warp increases, and cracks easily occur in the semiconductor layer 10.

Taking into account the above description, effects of the semiconductor device 100 according to the first embodiment will now be described. In the semiconductor device 100 according to the first embodiment, the control layer 50 that has a smaller linear expansion coefficient than the drain electrode 40 is located under the drain electrode 40. The temperature of the reflow furnace is increased in a state in which the drain electrode 40 is sandwiched between the semiconductor layer 10 and the control layer 50.

Because the drain electrode 40 in which a bending stress is easily generated is sandwiched between the control layer 50 and the semiconductor layer 10 that have smaller linear expansion coefficients than the drain electrode 40, the bending stress that is caused by the linear expansion coefficient difference can be suppressed. The convex-shaped warp of the semiconductor layer 10 and the drain electrode 40 that is caused by the bending stress is suppressed thereby; therefore, by providing the control layer 50, the occurrence of cracks in the semiconductor layer 10 can be suppressed while maintaining a low resistance in the on-operation.

Heat is generated when using the semiconductor device 100 according to the first embodiment; and there are cases where the temperature around the semiconductor device 100 increases. In such a case as well, there is a risk that cracks may occur in the semiconductor layer 10 due to the warp caused by the bending stress; however, by providing the control layer 50, the occurrence of cracks in the semiconductor layer 10 can be suppressed.

When manufacturing the semiconductor device 300 of the comparative example, sputtering is used to form the second metal layer 42, the third metal layer 43, and a portion of the first metal layer 41 at the first surface P1 of the semiconductor layer 10. When sputtering is used, high-energy particles collide with the semiconductor layer 10; therefore the second metal layer 42, the third metal layer 43, and the portion of the first metal layer 41 are formed in a state in which the temperature of the semiconductor layer 10 is increased. Then the first metal layer 41 and the fourth metal layer 44 are formed by plating. When plating is used, the metal layers are formed at a temperature that is near room temperature. Therefore, the temperature of the semiconductor layer 10 and the metal layers is reduced from the process of forming the second metal layer 42, the third metal layer 43, and the portion of the first metal layer 41 to the process of forming the first metal layer 41 and the fourth metal layer 44. As described above, generally, the linear expansion coefficient of the drain electrode 40 is greater than the linear expansion coefficient of the semiconductor layer 10; therefore, the contraction amount of the drain electrode 40 is greater than that of the semiconductor layer 10, Therefore, bending stress is generated so that the surface area of the drain electrode 40 that has a large contraction amount is reduced; and the semiconductor layer 10 and the drain electrode 40 distort to be convex at the semiconductor layer 10 side. When warp occurs in the wafer state, singulation is difficult; and because warp remains even after singulation, there is a risk that mounting defects may occur when mounting the semiconductor device 100 to the wiring substrate 200.

On the other hand, in the semiconductor device 100 according to the first embodiment, the control layer 50 is formed after forming the fourth metal layer 44. Because the control layer 50 is formed by sputtering, the temperatures of the semiconductor layer 10 and the drain electrode 40 are increased. The warp that occurred when forming the drain electrode 40 is eliminated by the temperature increase. Although the temperature is reduced after the formation of the control layer 50, the drain electrode 40 in which bending stress is easily generated is sandwiched between the control layer 50 and the semiconductor layer 10 that have smaller linear expansion coefficients than the drain electrode 40; therefore, the bending stress that is caused by the linear expansion coefficient difference can be suppressed. Therefore, the convex-shaped warp of the semiconductor layer 10 and the drain electrode 40 due to the bending stress can be suppressed by providing the control layer 50.

According to the embodiments, a semiconductor device can be provided in which warp and cracks of a semiconductor element can be suppressed.

While certain embodiments have been described, these embodiments have been presented by way of example only, and are not intended to limit the scope of the inventions, Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions,

What is claimed is:

1. A semiconductor device, comprising:
   a first transistor including
      a first region of a semiconductor layer, the first region including a first surface and a second surface of the semiconductor layer, the second surface facing the first surface in a first direction,
      a first electrode electrically connected with the second surface of the first region, and
      a first gate electrode located in the first region;
   a second transistor including
      a second region of the semiconductor layer, the second region including the first and second surfaces of the semiconductor layer and being next to the first region in a second direction, the second direction crossing the first direction,
      a second gate electrode located in the second region, and
      a second electrode separated from the first electrode, the second electrode being electrically connected with the second surface of the second region;
   a third electrode located at the first surface side, the third electrode being electrically connected with the first and second transistors; and
   a control layer,
   the third electrode being positioned between the first surface and the control layer,
   the control layer having a smaller linear expansion coefficient than the third electrode.

2. The device according to claim 1, wherein
   the third electrode includes:
      a first metal layer;
      a second metal layer located between the first metal layer and the first surface;
      a third metal layer located between the first metal layer and the second metal layer; and
      a fourth metal layer located between the first metal layer and the control layer,
   a thickness in the first direction of the first metal layer is greatest among the metal layers of the third electrode, and
   the control layer has a smaller linear expansion coefficient than the first metal layer.

3. The device according to claim 2, wherein
   a thickness of the first metal layer in the first direction is not less than 10 µm, and
   a thickness of the semiconductor layer in the first direction is not more than 100 µm.

4. The device according to claim 2, wherein
   the first metal layer includes at least one of silver or copper.

5. The device according to claim 1, wherein
   the control layer includes at least one of silicon, tungsten, molybdenum, or chrome.

* * * * *